United States Patent
Turin

(10) Patent No.: US 7,656,974 B2
(45) Date of Patent: Feb. 2, 2010

(54) ITERATIVE DECODING

(76) Inventor: William Turin, 25 Hillwood Rd., East Brunswick, NJ (US) 08816

( * ) Notice: Subject to any disclaimer, the term of this patent is extended or adjusted under 35 U.S.C. 154(b) by 0 days.

(21) Appl. No.: 12/290,811

(22) Filed: Nov. 4, 2008

(65) Prior Publication Data

US 2009/0074116 A1    Mar. 19, 2009

Related U.S. Application Data

(63) Continuation of application No. 10/789,794, filed on Feb. 28, 2004, now Pat. No. 7,447,280, which is a continuation of application No. 09/549,201, filed on Apr. 13, 2000, now Pat. No. 6,700,937.

(60) Provisional application No. 60/174,601, filed on Jan. 5, 2000.

(51) Int. Cl.
     *H04L 27/06*    (2006.01)
(52) U.S. Cl. ................................................. 375/341
(58) Field of Classification Search ................. 375/262, 375/265, 340–341; 714/755, 791–792, 794–795
See application file for complete search history.

(56) References Cited

U.S. PATENT DOCUMENTS

| | | | |
|---|---|---|---|
| 5,721,746 A | * | 2/1998 | Hladik et al. ............... 714/792 |
| 6,161,209 A | | 12/2000 | Moher |
| 6,167,552 A | * | 12/2000 | Gagnon et al. ............... 714/793 |
| 6,182,261 B1 | * | 1/2001 | Haller et al. ................. 714/758 |
| 6,223,319 B1 | * | 4/2001 | Ross et al. ................... 714/755 |
| 6,327,317 B1 | | 12/2001 | Chennakeshu |
| 6,343,368 B1 | * | 1/2002 | Lerzer ......................... 714/796 |
| 6,377,610 B1 | * | 4/2002 | Hagenauer et al. .......... 375/136 |
| 6,480,552 B1 | | 11/2002 | Tonello |
| 6,563,877 B1 | | 5/2003 | Abbaszadeh |

* cited by examiner

*Primary Examiner*—Khanh C Tran

(57) ABSTRACT

This invention provides an iterative process to maximum a posteriori (MAP) decoding. The iterative process uses an auxiliary function which is defined in terms of a complete data probability distribution. The auxiliary function is derived based on an expectation maximization (EM) algorithm. For a special case of trellis coded modulators, the auxiliary function may be iteratively evaluated by a combination of forward-backward and Viterbi algorithms. The iterative process converges monotonically and thus improves the performance of any decoding algorithm. The MAP decoding minimizes a probability of error. A direct approach to achieve this minimization results in complexity which grows exponentially with T, where T is the size of the input. The iterative process avoids this complexity by converging on the MAP solution through repeated maximization of the auxiliary function.

1 Claim, 5 Drawing Sheets

000
ITERATIVE DECODING

This is a continuation of U.S. patent application Ser. No. 10/789,794 filed Feb. 28, 2004, now U.S. Pat. No. 7,447,280 which is a continuation of U.S. patent application Ser. No. 09/549,201 filed Apr. 13, 2000, now U.S. Pat. No. 6,700,937 that followed provisional application No. 60/174,601 entitled "Map Decoding In Channels With Memory" filed on Jan. 5, 2000 now U.S. Pat. No. 6,700,937, issued Mar. 2, 2004. All materials included in the aforementioned applications directly or by incorporation are hereby incorporated by reference including all references cited therein.

BACKGROUND OF THE INVENTION

1. Field of Invention

This invention relates to iterative decoding of input sequences.

2. Description of Related Art

Maximum a posteriori (MAP) sequence decoding selects a most probable information sequence $X_1^T=(X_1, X_2, \ldots, X_T)$ that produced the received sequence $Y_1^T=(Y_1, Y_2, \ldots, Y_T)$. For transmitters and/or channels that are modeled using Hidden Markov Models (HMM), the process for obtaining the information sequence $X_1^T$ that corresponds to a maximum probability is difficult due to a large number of possible hidden states as well as a large number of possible information sequences $X_1^T$. Thus, new technology is needed to improve MAP decoding for HMMs.

SUMMARY OF THE INVENTION

This invention provides an iterative process to maximum a posteriori (MAP) decoding. The iterative process uses an auxiliary function which is defined in terms of a complete data probability distribution. The MAP decoding is based on an expectation maximization (EM) algorithm which finds the maximum by iteratively maximizing the auxiliary function. For a special case of trellis coded modulation, the auxiliary function may be maximized by a combination of forward-backward and Viterbi algorithms. The iterative process converges monotonically and thus improves the performance of any decoding algorithm.

The MAP decoding decodes received inputs by minimizing a probability of error. A direct approach to achieve this minimization results in a complexity which grows exponentially with T, where T is the size of the input. The iterative process avoids this complexity by converging on the MAP solution through repeated use of the auxiliary function.

BRIEF DESCRIPTION OF THE DRAWINGS

The invention is described in detail with reference to the following figures where like numerals reference like elements, and wherein.

DETAILED DESCRIPTION OF PREFERRED EMBODIMENTS

Figure 1:
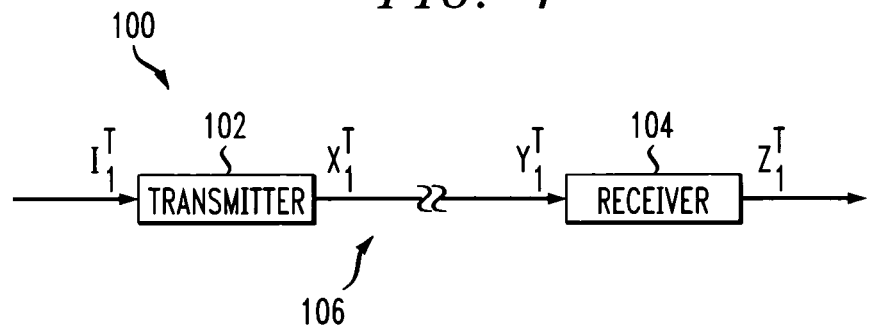
FIG. 1 shows a diagram of a communication system.

FIG. 1 shows an exemplary block diagram of a communication system 100. The communication system 100 includes a transmitter 102, a channel 106 and a receiver 104. The transmitter 102 receives an input information sequence $I_1^T$ (i.e., $I_1, I_2, \ldots, I_T$) of length T, for example. The input information sequence may represent any type of data including analog voice, analog video, digital image, etc. The transmitter 102 may represent a speech synthesizer, a signal modulator, etc.; the receiver 104 may represent a speech recognizer, a radio receiver, etc.; and the channel 106 may be any medium through which the information sequence $X_1^T$ (i.e., $X_1, X_2, \ldots, X_T$) is conveyed to the receiver 104. The transmitter 102 may encode the information sequence $I_1^T$ and transmit encoded information sequence $X_1^T$ through the channel 106 and the receiver 104 receives information sequence $Y_1^T$ (i.e., $Y_1, Y_2, \ldots, Y_T$). The problem in communications is, of course, to decode $Y_1^T$ in such a way as to retrieve $I_1^T$.

Maximum a posteriori (MAP) sequence decoding is a technique that decodes the received sequence $Y_1^T$ by minimizing a probability of error to obtain $X_1^T$ (and if a model of the transmitter 102 is included, to obtain $I_1^T$). In MAP, the goal is to choose a most probable $X_1^T$ that produces the received $Y_1^T$. The MAP estimator may be expressed by equation 1 below.

$$\hat{X}_1^T = \underset{X_1^T}{\mathrm{argmax}} Pr(X_1^T, Y_1^T) \tag{1}$$

where Pr(·) denotes a corresponding probability or probability density function and $\hat{X}_1^T$ is an estimate of $X_1^T$. Equation 1 sets $\hat{X}_1^T$ to the $X_1^T$ that maximizes $Pr(X_1^T, Y_1^T)$.

The $Pr(X_1^T, Y_1^T)$ term may be obtained by modeling the channel 106 of the communication system 100 using techniques such as Hidden Markov Models (HMMs). An input-output HMM $\lambda=(S, X, Y, \pi, \{P(X,Y)\})$ is defined by its internal states $S=\{1, 2, \ldots n\}$, inputs X, outputs Y, initial state probability vector $\lambda$, and the input-output probability density matrices (PDMs) $P(X,Y)$, $X \in X$, $Y \in Y$. The elements of $P(X, Y)$, $p_{ij}(X,Y)=Pr(j,X,Y|i)$, are conditional probability density functions (PDFs) of input x and corresponding output y after transferring from the state i to state j. It is assumed that the state sequence $S_0^t=(S_0, S_1, \ldots, S_t)$, input sequence $X_1^t=(X_1, X_2, \ldots X_t)$, and output sequence $Y_1^t=(Y_1, Y_2, \ldots, Y_t)$ possess the following Markovian property $$Pr(S_t, X_t, Y_t | S_0^{t-1}, Y_1^{t-1}) = Pr(S_t, X_t, Y_t | S_{t-1}).$$

Using HMM, the PDF of the input sequence $X_1^T$ and output sequence $Y_1^T$ may be expressed by equation 2 below:

$$p_T(X_1^T, Y_1^T) = \pi \prod_{i=1}^{T} P(X_i, Y_i) 1 \tag{2}$$

where 1 is a column vector of n ones, $\pi$ is a vector of state initial probabilities, and n is a number of states in the HMM. Thus, the MAP estimator when using HMM may be expressed by equation 3 below:

$$\hat{X}_1^T = \underset{X_1^T}{\operatorname{argmax}}\left[\pi\prod_{i=1}^T P(X_i, Y_i)1\right] \quad (3)$$

The maximization required by equation 3 is a difficult problem because all possible sequences of $X_1^T$ must be considered. This requirement results in a complexity that grows exponentially with T. This invention provides an iterative process to obtain the maximum without the complexity of directly achieving the maximization by evaluating equation 2 for all possible $X_1^T$, for example. In the iterative process, an auxiliary function is developed whose iterative maximization generates a sequence of estimates for $X_1^T$ approaching the maximum point of equation 2.

The iterative process is derived based on the expectation maximization (EM) algorithm. Because the EM algorithm converges monotonically, the iterative process may improve the performance of any decoding algorithm by using its output as an initial sequence of the iterative decoding algorithm. In the following description, it is assumed that HMM parameters for the channel 106 and/or the transmitter 102 are available either by design or by techniques such as training.

The auxiliary function may be defined in terms of a complete data probability distribution shown in equation 4 below.

$$\Psi(z, X_1^T, Y_1^T) = \pi_{i_o}\prod_{t=1}^T p_{i_{t-1}i_t}(X_t, Y_t), \quad (4)$$

where $z=i_0^T$ is an HMM state sequence, $\pi_{i_o}$ is an initial probability vector for state $i_0$, and $p_{ij}(X,Y)$ are the elements of the matrix $P(X,Y)$. The MAP estimator of equation 1 can be obtained iteratively by equations 5-9 as shown below.

$$X_{1,p+1}^T = \underset{X_1^T}{\operatorname{argmax}} Q(X_1^T, X_{1,p}^T), \; p = 0, 1, 2, \ldots \quad (5)$$

where p is a number of iterations and $Q(X_i^t, X_{i,p}^t)$ is the auxiliary function which may be expressed as $$Q(X_1^T, X_{1,p}^T) = \sum_z \Psi(z, X_{1,p}^T, Y_1^T)\log(\Psi(z, X_1^T, Y_1^T)). \quad (6)$$

The auxiliary function may be expanded based on equation 4 as follows:

$$Q(X_1^T, X_{1,p}^T) = \sum_{t=1}^T\sum_{i=1}^n\sum_{j=1}^n \gamma_{t,ij}(X_{1,p}^T)\log(p_{ij}(X_t, Y_t)) + C \quad (7)$$

where C does not depend on $X_1^T$, n is a number of states in the HMM and $$\gamma_{t,ij}(X_{1,p}^T)=\alpha_i(X_{1,p}^{t-1},Y_1^{t-1})p_{ij}(X_{t,p},Y_t)\beta_j(X_{t+1,p}^T,Y_{t+1}^T) \quad (8)$$

where $\alpha_i(X_{1,p}^t, Y_1^t)$ and $\beta_j(X_{t+1,p}^T, Y_{t+1}^T)$ are the elements of the following forward and backward probability vectors $$\alpha(X_1^T, Y_1^T) = \pi\prod_{i=1}^T P(X_i, Y_i), \quad (9)$$

and $$\beta(X_{t+1}^T, Y_{t+1}^T) = \prod_{i=t+1}^T P(X_i, Y_i)1.$$

Based on equations 5-9, the iterative process may proceed as follows. At p=0, an initial estimate of $X_{1,0}^T$ is generated. Then, $Q(X_1^T, X_{1,0}^T)$ is generated for all possible sequences of $X_1^T$. From equations 7 and 8, $Q(X_1^T, X_{1,0}^T)$ may be evaluated by generating $\gamma_{t,ij}(X_{1,0}^T)$ and log $(p_{ij}(X_t,Y_t))$ for each t, i, and j. $\gamma_{t,ij}(X_{1,0}^T)$ may be generated by using the forward-backward algorithm as shown below:

$$\alpha(X_{1,p}^0, Y_1^0)=\pi, \alpha(X_{1,p}^t, Y_1^t)=\alpha(X_{1,p}^{t-1}, Y_1^{t-1})P(X_{t,p}, Y_t),$$
$$t=1,2,\ldots T$$

$$\beta(X_{T+1,p}^T, Y_{T+1}^T)=1, \beta(X_{t,p}^T, Y_t^T)=P(X_{t+1,p}^T, Y_{t+1}^T), t=T-1, T-2, \ldots, 1$$

Log$(p_{ij}(X_t,Y_t))$ is generated for all possible $X_t$ for t=1, 2, ..., T and the $(X_t)$s that maximize $D(X_1^T, X_{1,0}^T)$ are selected as $X_{1,1}^T$. After $X_{1,1}^T$ is obtained, it is compared with $X_{1,0}^T$. If a measure $D(X_{1,1}^T, X_{1,0}^T)$ of difference between the sequences exceeds a compare threshold, then the above process is repeated until the difference measure $D(X_{1,p}^T, X_{1,p-1}^T)$ is within the threshold. The last $X_{1,p}^T$ for p iterations is the decoded output. The measure of difference may be an amount of mismatch information. For example, if $X_1^T$ is a sequence of symbols, then the measure may be a number of different symbols between $X_{1,p}^T$ and $X_{1,p-1}^T$ (Hamming distance); if $X_1^T$ is a sequence of real numbers, then the measure may be an Euclidean distance $D(X_{1,p}^T, X_{1,p-1}^T)=[\sum_{i=1}^T(X_{i,p}-X_{i,p-1})^2]^{1/2}$.

Figure 2:
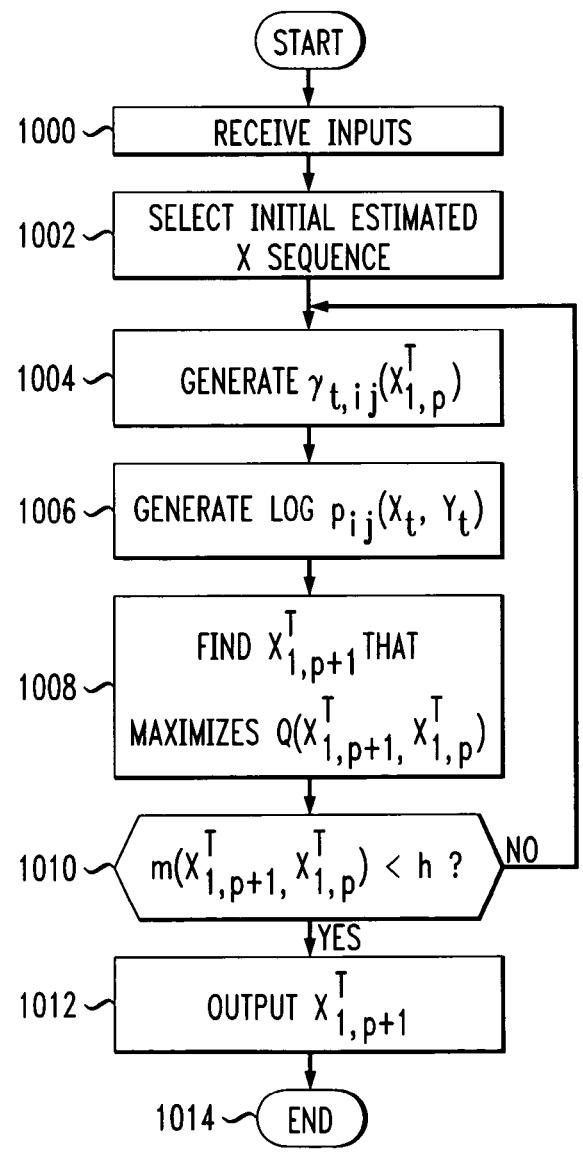
FIG. 2 shows a flow chart of an exemplary iterative process.

FIG. 2 shows a flowchart of the above-described process. In step 1000, the receiver 104 receives the input information sequence $Y_1^T$ and goes to step 1002. In step 1002, the receiver 104 selects an initial estimate for the decode output information sequence $X_{1,0}^T$ and goes to step 1004. In step 1004, the receiver 104 generates $\gamma_{t,ij}(X_{1,p}^T)$ where p=0 for the first iteration and goes to step 1006. In step 1006, the receiver 104 generates all the log $(p_{ij}(X_t,Y_t))$ values and goes to step 1008.

In step 1008, the receiver 104 selects a sequence $X_{1,p+1}^T$ that maximizes $Q(X_{1,p+1}^T, X_{1,p}^T)$ and goes to step 1010. In step 1010, the receiver 104 compares $X_{1,p}^T$ with $X_{1,p+1}^T$. If the compare result is within the compare threshold, then the receiver 104 goes to step 1012; otherwise, the receiver 104 returns to step 1004 and continues the process with the new sequence $X_{1,p+1}^T$. In step 1012, the receiver 104 outputs $X_{1,p+1}^T$, and goes to step 1014 and ends the process.

The efficiency of the above described iterative technique may be improved if the transmitted sequence is generated by modulators such as a trellis coded modulator (TCM). A TCM may be described as a finite state machine that may be defined by equations 10 and 11 shown below.

$$S_{t+1}=f_t(S_t,I_t) \quad (10)$$

$$X_t=g_t(S_t,I_t) \quad (11)$$

Equation 10 specifies the TCM state transitions while equation 11 specifies the transmitted information sequence based on the state and the input information sequence. For example, after receiving input $I_t$ in state $S_t$, the finite state machine transfers to state $S_{t+1}$, based on $S_t$ and $I_t$ as shown in equation 10. The actual output by the transmitter 102 is $X_t$ according to equation 11. Equation 10 may represent a convolutional encoder and equation 11 may represent a modulator. For the above example, the transmitter output information sequence $X_1^T$ may not be independent even if the input information sequence $I_1^T$ is independent.

In equation 15, the $\log(p_{ij}(Y_t,X_t))$ term may be analyzed based on the TCM state transitions because the information actually transmitted X is related to the source information $I_t$ by $X_t=g_t(S_t, I_t)$. This relationship between $X_t$ and $I_t$ forces many elements $p_{ij}(Y_t,X_t)$ of $P(Y_t,X_t)$, to zero since the finite state machine (equations 10 and 11) removes many possibilities that otherwise must be considered. Thus, unlike the general case discussed in relation to equations 5-9, evaluation of $p_{ij}(Y_t,X_t)$ may be divided into a portion that is channel related and another portion that is TCM related. The following discussion describes the iterative technique in detail for the TCM example.

For a TCM system with an independent and identically distributed information sequence, an input-output HMM may be described by equations 12 and 13 below.

$$P(X_t, Y_t) = \lfloor p_{S_t S_{t+1}} P_c(X_t \mid Y_t) \rfloor, \quad (12)$$

where $$p_{S_t S_{t+1}} = \begin{cases} Pr(I_t) & \text{if } S_{t+1} = f_t(S_t, I_t) \\ 0 & \text{otherwise} \end{cases} \quad (13)$$

$P_c(Y_t|X_t)$ is the conditional PDM of receiving $Y_t$ given that $X_t$ has been transmitted for the HMM of a medium (channel) through which the information sequence is transmitted; $p_{S_t S_{t+1}}$ is the probability of the TCM transition from state $S_t$ to state $S_{t+1}$, and $Pr(I_t)$ is the probability of an input $I_t$. Thus, equation 2 may be written as $$p_T(I_1^T, Y_1^T) = \pi_c \prod_{t=1}^{T} p_{S_t S_{t+1}} P_c(Y_t \mid X_t) 1, \quad (40)$$

where $\pi$ is a vector of the initial probabilities of the channel states, $X_t=g_t(S_t,I_t)$, and the product is taken along the state trajectory $S_{t+1}=f_t(S_t,I_t)$ for t=1, 2, ..., T.

If all elements of the input information sequence are equally probable, then the MAP estimate may be expressed by equation 14 below.

$$\hat{I}_1^T = \underset{I_1^T}{\operatorname{argmax}} \pi_c \prod_{t=1}^{T} P_c(Y_t \mid X_t) 1, \quad (14)$$

The auxiliary function may be expressed by equations 15-17 below corresponding to equations 7-9 above.

$$Q(I_1^T, I_{1,p}^T) = \sum_{t=1}^{T} \sum_{i=1}^{n} \sum_{j=1}^{n} \cdot \gamma_{t,ij}(I_{1,p}^T) \log(p_{ij}(Y_t \mid X_t)) + C \quad (15)$$

where $X_t=g_t(S_t,I_t)$ and $$\gamma_{t,ij}(I_{1,p}^T)=\alpha_i(Y_1^{t-1}|I_{1,p}^{t-1})p_{c,ij}(Y_t|X_{t,p})\beta_j(Y_{t+1}^T|I_{t+1,p}^T) \quad (16)$$

$\alpha_i(Y_1^{T-1}|I_{1,p}^{t-1})$ and $\beta_j(Y_{t+1}^T|I_{t+1,p}^T)$ are the elements of the forward and backward probability vectors $$\alpha(Y_1^T \mid I_1^T) = \pi_c \prod_{i=1}^{t} P_c(Y_i \mid X_i) \quad (17)$$

and $$\beta(Y_{t+1}^T \mid I_{t+1}^T) = \prod_{i=t+1}^{T} P_c(Y_i \mid X_i) 1$$

From equation 15, the Viterbi algorithm may be applied with the branch metric $$m(I_t) = \sum_{i=1}^{n} \sum_{j=1}^{n} \gamma_{t,ij}(I_{1,p}^T) \log p_{c,ij}(Y_t \mid X_t), \, t = 1, 2, \ldots, T \quad (18)$$

to find a maximum of $Q(I_1^T, I_{1,p}^T)$ which can be interpreted as a longest path leading from the initial zero state to one of the states $S_T$ where only the encoder trellis is considered. The Viterbi algorithm may be combined with the backward portion of the forward-backward algorithm as follows.

1. Select an initial source information sequence $I_{1,0}^T=I_{1,0}, I_{2,0}, \ldots, I_{T,0}$
2. Forward part:
   a. set $\alpha(Y_1^0|I_1^0)=\pi$, where $\pi$ is an initial state probability estimate; and
   b. for t=1, 2, ..., T, compute $X_{t,p}=g_t(S_t,I_{t,p})$, $\alpha(Y_1^t|I_{1,p}^t)=\alpha(Y_1^{t-1}|I_{1,p}^{t-1})P_c(Y_t|X_{1,p})$, where $I_{1,p}^t$ is a prior estimate of $I_1^t$.
3. Backward part:
   a. set $\beta(Y_{T+1}^T|I_{T+1,p}^T)=1$ and last state transition lengths $L(S_T)$ to 0 for all the states;
   for t=T,T−1, ..., 1 compute:
   b. $X_t=g_t(S_t,I_t)$,
   c. $\gamma_{t,ij}(I_{1,p}^T)=\alpha_i(Y_1^{t-1}|I_{1,p}^{t-1})p_{c,ij}(Y_t|X_{t,p})\beta_j(Y_{t+1}^T|I_{t-1,p}^T)$,
   d.

$$L(S_t) = \max_{I_t} \{L\lfloor f_t(S_t, I_t) \rfloor + m(I_t)\}.$$

This step selects the paths with the largest lengths (the survivors).

e.

$$\hat{I}_t(S_t) = \underset{I_1}{\operatorname{argmax}} \{L[f_t(S_t, I_t)] + m(I_t)\}.$$

This step estimates $I_t$ corresponding to the state $S_t$ by selecting the $I_t$ of the survivor in step d.

f. $\beta(Y_t^T|I_{t,p}^T)=P_c(Y_t|X_{t,p})\beta(Y_{t+1}^T|X_{t+1,p}^T)$.
g. End (of "for" loop).

4. Reestimate the information sequence:

$I_{t,p+1}=\hat{I}_t(\hat{S}_t)=f_t(\hat{S}_t,I_{t,p+1}), t=1, 2, \ldots, T$ where $\hat{S}_1=0$;
and 5. If $T_{t,p+1} \ne I_{t,p}$, go to step 2; otherwise decode the information sequence as $I_{t,p+1}^T$.

FIGS. 3-6 show an example of the iterative process discussed above where there are four states in the TCM and T=5.

The dots represent possible states and the arrows represent a state trajectory that corresponds to a particular information sequence. The iterative process may proceed as follows. First, an initial input information sequence $I_{1,0}^5$ is obtained. $I_{1,0}^5$ may be the output of an existing decoder or may simply be a guess.

The Viterbi algorithm together with the backward algorithm may be used to obtain a next estimate of the input information sequence $I_{1,1}^5$. This process begins with the state transitions between $t=4$ and $t=5$ by selecting state transitions leading to each of the states s0-s3 at $t=4$ from states at $t=5$ that have the largest value of the branch metric $L(S_4)=m(I_5)$ of equation 18 above. Then, the process moves to select state transitions between the states at $t=3$ and $t=4$ that have the largest cumulative distance $L(S_3)=L(S_4)+m(I_4)$. This process continues until $t=0$ and the sequence of input information I' corresponding to the path connecting the states from $t=0$ to $t=5$ that has the longest path $$L(S_0) = \sum_{t=1}^{5} m(I_t)$$

is selected as the next input information sequence $I_{1,1}^5$.

Figure 3:
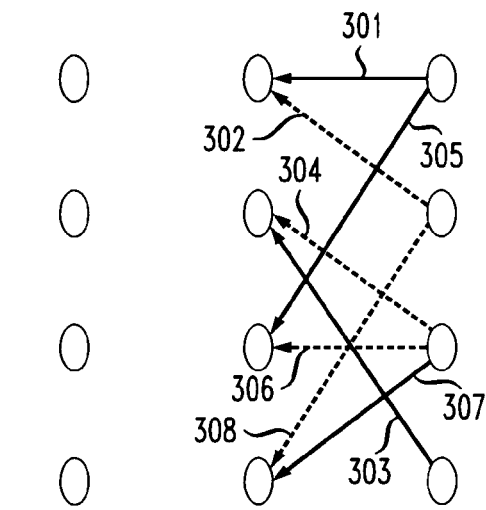
FIGS. 3-6 show state trajectories determined by the iterative process.

For the example in FIG. 3, state transitions from the states at $t=4$ to all the states at $t=5$ are considered. Assuming that the $(I_t)$s are binary, then only two transitions can emanate from each of the states at $t=4$: one transition for $I_5=0$ and one transition for $I_5=1$. Thus, FIG. 3 shows two arrows terminating on each state at $t=4$ (arrows are "backwards" because the backward algorithm is used). State transitions 301 and 302 terminate at state s0; state transitions 303 and 304 terminate at state s1; state transitions 305 and 306 terminate at state s2; and state transitions 307 and 308 terminate at state s3.

The branch metric $m(I_t)$ of equation 18 represents a "distance" between the states and is used to select the state transition that corresponds to the longest path for each of the states s0-s3 at $t=4$:

$$m(I_5) = \sum_i \sum_j \gamma_{5,ij}(X_{1,0}^5) \log p_{ij}(X_5, Y_5) \quad (19)$$

$$= \sum_i \sum_j \alpha_i(X_{1,0}^4, Y_1^4) p_{ij}(X_{5,0}, Y_5)$$

$$\beta_j(X_{6,0}^5, Y_6^5) \log p_{ij}(Y_5 \mid X_5),$$

where $\beta j(X_{6,0}^5, Y_6^5)=1$, and $X_5=g_5(S_5, I_5)$ by definition. There is an $I_5$ that corresponds to each of the state transitions 301-308. For this example, $L(S_4)=m(I_5)$ corresponding to odd numbered state transitions 301-307 are greater than that for even numbered state transitions 302-308. Thus, odd numbered state transitions are "survivors." Each of them may be part of the state trajectory that has the longest path from $t=0$ to $t=5$. This transition (the survivor) is depicted by the solid arrow while the transitions with smaller lengths are depicted by dashed lines.

Figure 4:
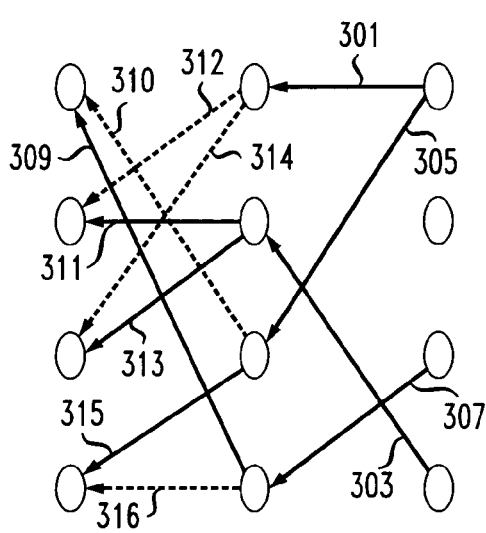

The state sequence determination process continues by extending the survivors to $t=3$ as shown in FIG. 4 forming state transitions 309-316. The distance between state transitions for each of the states are compared based on $L(S_4)+m(I_4)$, where $m(I_4)$ is shown in equation 20 below.

$$m(I_4) = \sum_i \sum_j \gamma_{5,ij}(X_{1,0}^5) \log p_{ij}(X_4, Y_4) \quad (20)$$

$$= \sum_i \sum_j \alpha_i(X_{1,0}^3, Y_1^3) p_{ij}(X_{4,0}, Y_4)$$

$$\beta_j(X_{5,0}, Y_5) \log p_{ij}(Y_4 \mid X_4).$$

For this example, the distances corresponding to the odd numbered state transitions 309-315 are longer than distances corresponding to even numbered state transitions 310-316. Thus, the paths corresponding to the odd numbered state transitions are the survivors. As shown in FIG. 4, the state transition 301 is not connected to any of the states at $t=3$ and thus is eliminated even though it was a survivor. The other surviving state transitions may be connected into partial state trajectories. For example, partial state trajectories are formed by odd numbered state transitions 307-309, 303-311, 303-313 and 305-315.

Figure 5:
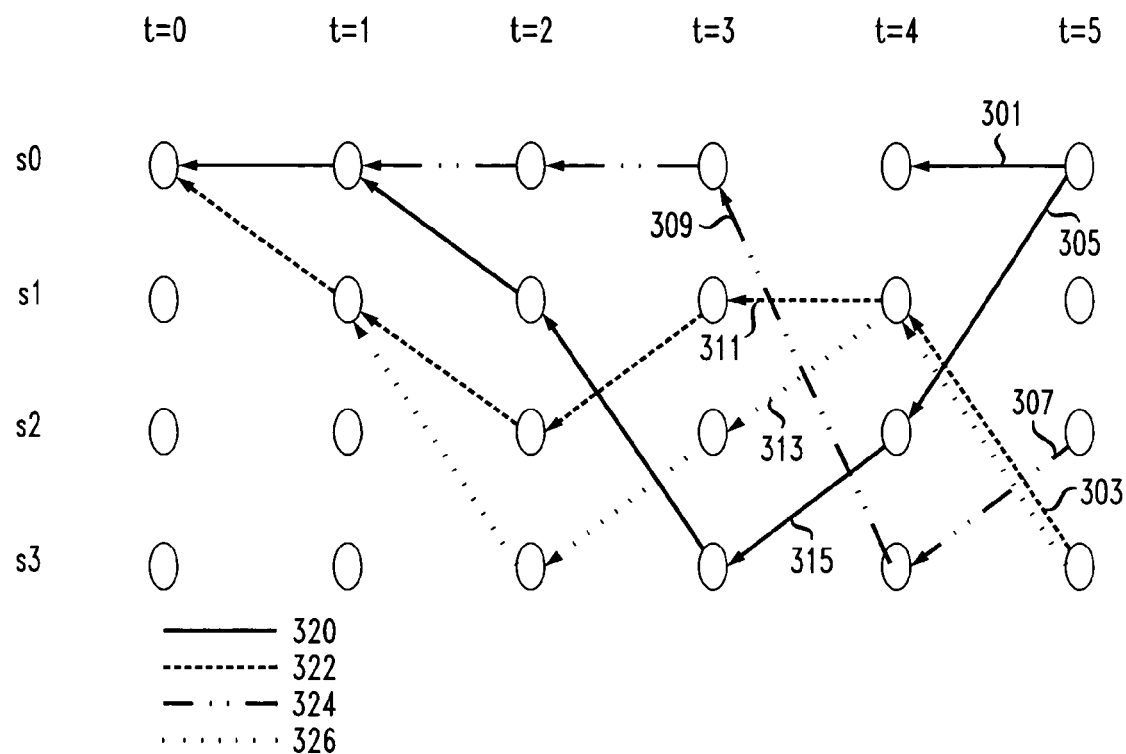
Figure 6:
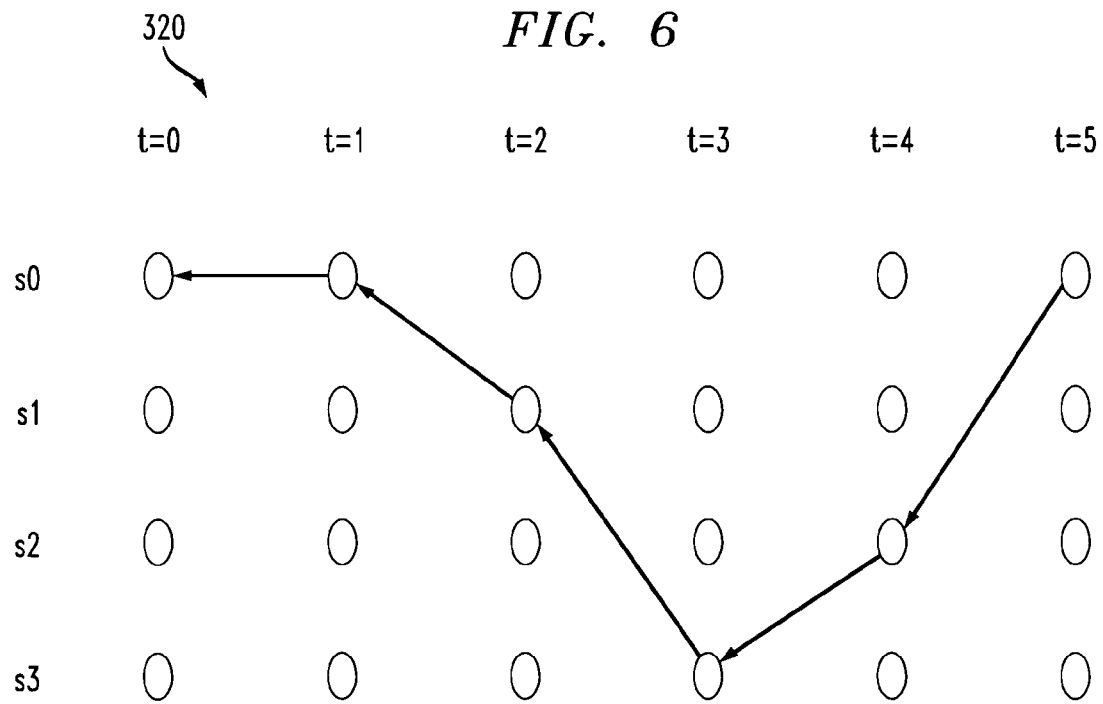

The above process continues until $t=0$ is reached as shown in FIG. 5 where two surviving state trajectories 320-322 are formed by the surviving state trajectories. All the state trajectories terminate at state zero for this example because, usually, encoders start at state zero. As shown in FIG. 6, the state trajectory that corresponds to the longest cumulative distance is selected and the input information sequence $I_1^5$ (via $S_{t+1}=f_t(S_t,I_t)$) that corresponds to the selected trajectory is selected as the next estimated input information sequence $\hat{I}_{1,1}^5$. For this example, the state trajectory 320 is selected and the input information sequence $I_1^5$ corresponding to the state trajectory 320 is selected as $\hat{I}_{1,1}^5$.

Figure 7:
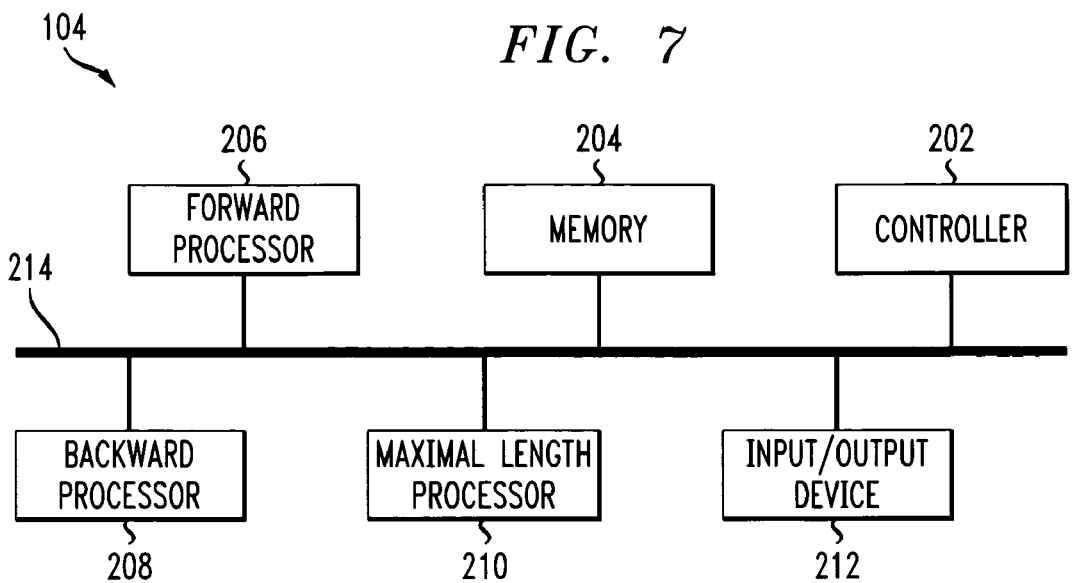
FIG. 7 shows an exemplary block diagram of the receiver shown in FIG. 1.

FIG. 7 shows an exemplary block diagram of the receiver 104. The receiver 104 may include a controller 202, a memory 204, a forward processor 206, a backward processor 208, a maximal length processor 210 and an input/output device 212. The above components may be coupled together via a signal bus 214. While the receiver 104 is illustrated using a bus architecture, any architecture may be suitable as is well known to one of ordinary skill in the art.

All the functions of the forward, backward and maximal length processors 206, 208 and 210 may also be performed by the controller 202 which may be either a general purpose or special purpose computer (e.g., DSP). FIG. 7 shows separate processors for illustration only. The forward, backward maximal length processors 206, 208 and 210 may be combined and may be implemented by using ASICs, PLAs, PLDs, etc. as is well known in the art.

The forward processor 206 generates the forward probability vectors $\alpha_i(X_{1,p}^{t-1}, Y_1^{t-1})$ herein referred to as $\alpha_i$. For every iteration, when a new $X_{1,p}^T$ (or $I_{1,p}^T$) is generated, the forward processor 206 may generate a complete set of $\alpha_i$.

The backward processor 208 together with the maximal length processor 210 generate a new state sequence by searching for maximal length state transitions based on the branch metric $m(I_t)$. Starting with the final state transition between states corresponding to $t=T-1$ and $t=T$, the backward processor generates $\beta_j(X_{t+1}^T, Y_{t+1}^T)$ (hereinafter referred as $\beta_j$) as shown in equation 8 for each state transition.

The maximal length processor 210 generates $m(I_t)$ based on the results of the forward processor 206, the backward processor 208 and $p_{ij}(X_t, Y_t)$. After generating all the $m(I_t)$s corresponding to each of the possible state transitions, the maximal length processor 210 compares all the $L(S_t)+m(I_t)$s and selects the state transition that corresponds to the largest $L(S_t)+m(I_t)$, and the $I_t$ (via $S_{t+1}=f_t(S_t, I_t)$) that corresponds to the selected state transition is selected as the estimated input information for that t. The above process is performed for each $t=1, 2, \ldots, T$ to generate a new estimate $I_{1,p}^T$ for each of the iteration p.

Initially, the controller 202 places an estimate of the PDM P(X,Y) and $\pi$ in the memory 204 that corresponds to the HMM for the channel 106 and/or the transmitter 102. The PDM P(X,Y) may be obtained via well known training processes, for example.

When ready, the controller 202 receives the received input information sequence $Y_1^T$ and places them in the memory 204 and selects an initial estimate of $I_{1,0}^T$ (or $X_{1,0}^T$). The controller 202 coordinates the above-described iterative process until a new estimate $I_{1,1}^T$ (or $X_{1,1}^T$) is obtained. Then, the controller 202 compares $I_{1,0}^T$ with $I_{1,1}^T$ to determine if the compare result is below the compare threshold value (e.g., matching a predetermined number of elements or symbols of the information sequence). The compare threshold may be set to 0, in which case $I_{1,0}^T$ must be identical with $I_{1,1}^T$. If an acceptable compare result is reached, $I_{1,1}^T$ is output as the decoded output. Otherwise, the controller 202 iterates the above-described process again and compares the estimated $I_{1,p}^T$ with $I_{1,p}^T$ until an acceptable result is reached and $I_{1,p}^T$ is output as the decoded output.

Figure 8:
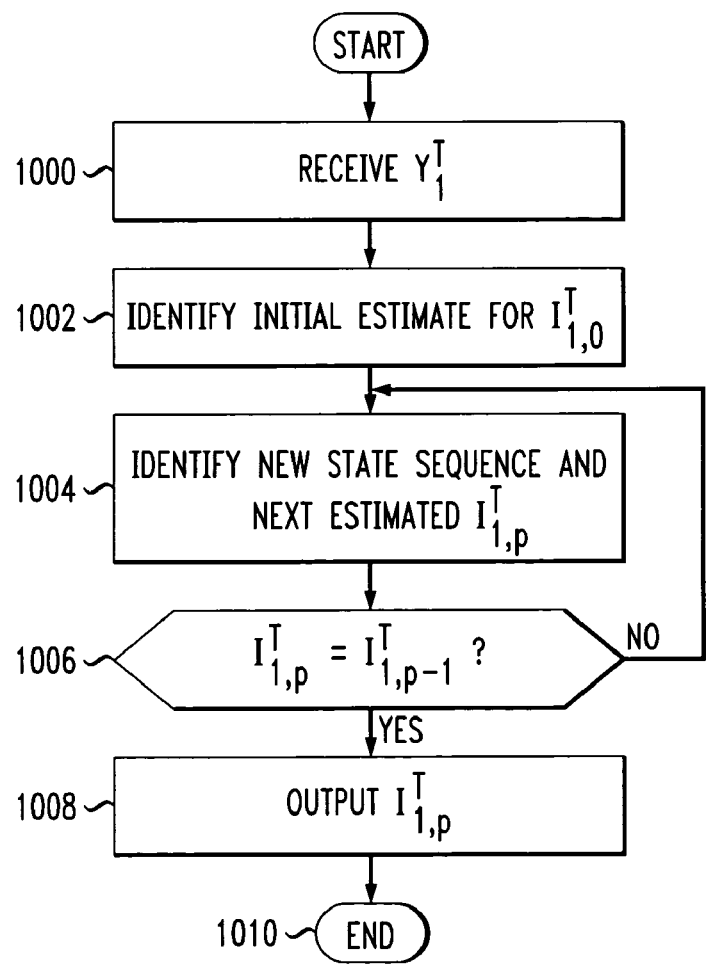
FIG. 8 shows a flowchart for an exemplary process of the iterative process for a TCM example.

FIG. 8 shows a flowchart of the above-described process. In step 1000, the controller 202 receives $Y_1^T$ via the input/output device 212 and places $Y_1^T$ in the memory 204 and goes to step 1002. In step 1002, the controller 202 selects an initial estimate for $I_{1,0}^T$ and goes to step 1004. In step 1004, the controller 202 determines a new state sequence and a next estimated $I_{1,1}^T$ ($I_{1,p}^T$, where p=1) (via the forward, backward and maximal length processors 206, 208 and 210) and goes to step 1006. In step 1006, the controller 202 compares $I_{1,0}^T$ with $I_{1,1}^T$. If the compare result is within the predetermined threshold, then the controller 202 goes to step 1008; otherwise, the controller 202 returns to step 1004. In step 1008, the controller 202 outputs $I_{1,p}^T$, where p is the index of the last iteration and goes to step 1010 and ends the process.

Figure 9:
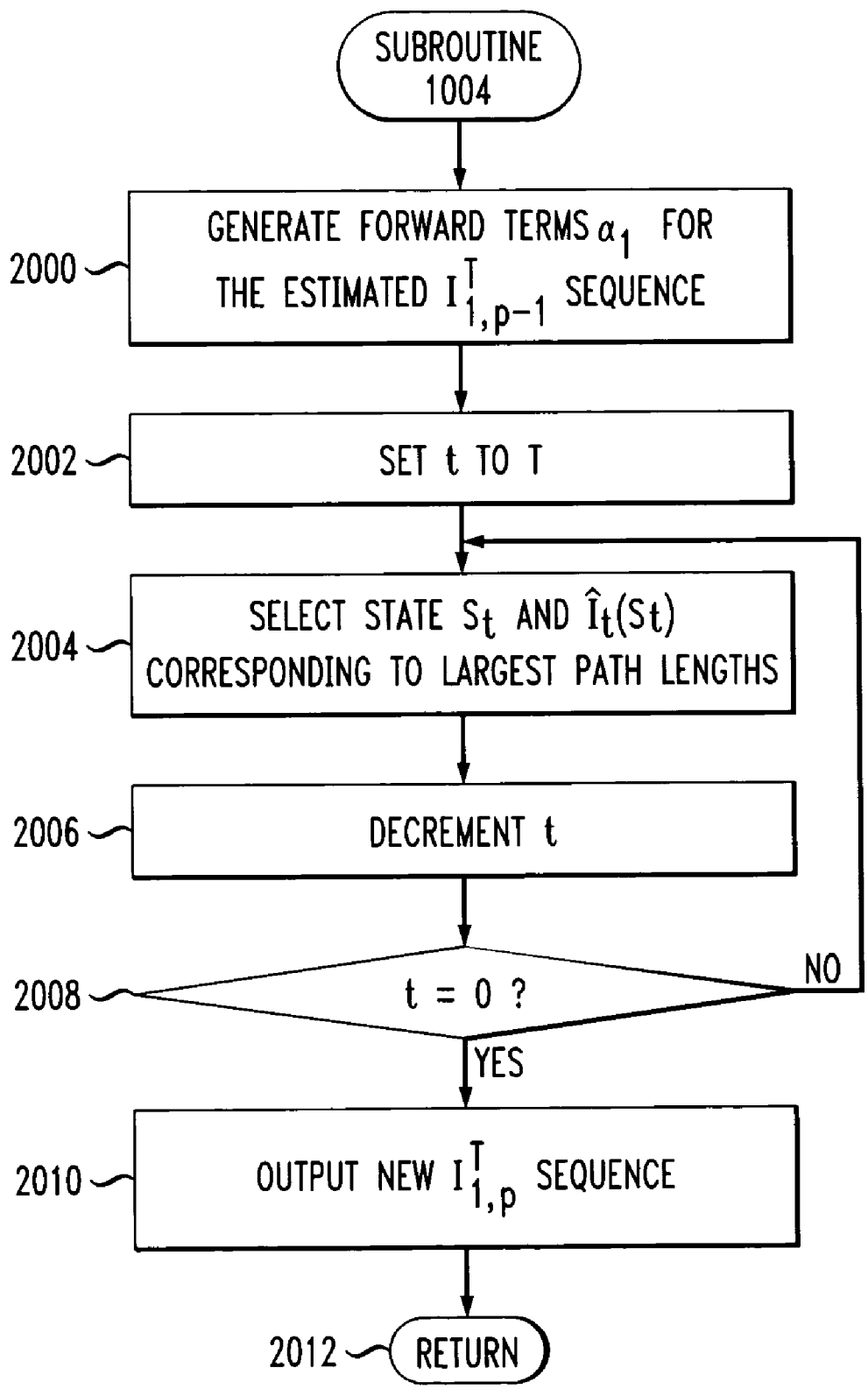
FIG. 9 shows step 1004 of the flowchart of FIG. 8 in greater detail.

FIG. 9 shows a flowchart that expands step 1004 in greater detail. In step 2000, the controller 202 instructs the forward processor 206 to generate $\alpha_i$ as shown in equation 8, and goes to step 2002. In step 2002, the controller 202 sets the parameter t=T and goes to step 2004. In step 2004, the controller 202 instructs the backward processor 208 to generate $\beta_j$ and the maximal length processor 210 to determine next set of survivors based on equation 18 and time t+1 survivors and goes to step 2006.

In step 2006, the controller 202 decrements t and goes to step 2008. In step 2008, the controller 202 determines whether t is equal to 0. If t is equal to 0, the controller 202 goes to step 2010; otherwise, the controller 202 returns to step 2004. In step 2010, the controller 202 outputs the new estimated $I_t^T$ and goes to step 2012 and returns to step 1006 of FIG. 5.

A specific example of the iterative process for convolutional encoders is enclosed in the appendix.

While this invention has been described in conjunction with specific embodiments thereof, it is evident that many alternatives, modifications, and variations will be apparent to those skilled in the art. Accordingly, preferred embodiments of the invention as set forth herein are intended to be illustrative, not limiting. Various changes may be made without departing from the spirit and scope of the invention.

For example, a channel may be modeled as $P_c(Y|X)=P_c B_c(Y|X)$ where $P_c$ is a channel state transition probability matrix and $B_c(Y|X)$ is a diagonal matrix of state output probabilities. For example, based on the Gilbert-Elliott model $$B_c(X|X) = \begin{bmatrix} 1-b_1 & 0 \\ 0 & 1-b_2 \end{bmatrix}$$

and $$B_c(\overline{X}|X) = \begin{bmatrix} b_1 & 0 \\ 0 & b_2 \end{bmatrix},$$

where $\overline{X}$ is the complement of X. For this case, $m(I_t)$ may be simplified as $$m(I_t) = \sum_{i=1}^{n_c} \gamma_{t,i}(I_{1,p}^T) b_j(Y_t | X_t), t = 1, 2, \ldots, T, \text{ and}$$

$\gamma_{t,i}(I_{1,p}^T) = \alpha_i(Y_1^t | I_{1,p}^t) \beta_i(Y_{t+1}^T | I_{t+1,p}^T)$, where by $b_j(Y_t | X_t)$ are the elements of $B_c$.

What is claimed is:

1. A method executed in a receiver that receives a vector Y of symbols $Y_i$, i=1, 2, . . . , T from a transmitter that transmits a vector X of symbols $X_i$, i=1, 2, . . . , T via a transmission medium that is modeled by an input output Hidden Markov Model defined by n internal states, having an initial state probability vector $\pi$ and an input-output probably density matrix $P(X_i, Y_i)$, where elements of $P(X_i, Y_i)$, $p_{ij}(X, Y)=\Pr(j, X, Y|i)$, are conditional probability density functions of input X and corresponding output Y after transferring from state i to state j, comprising the steps of:

creating an initial estimate vector $X_p$ of T symbols, with index p=0;

selecting symbols for estimate vector $X_{p+1}$ that maximize $$Q(X_1, X_{1,p}) = \sum_{t=1}^{T} \sum_{i=1}^{n} \sum_{j=1}^{n} \gamma_{t,ij}(X_{1,p}) \log(p_{ij}(X_t, Y_t) + C$$

where
$\gamma_{t,ij}(X_{1,p}) = \alpha_i(X_{1,p}^{t-1}, Y_1^{t-1}) p_{ij}(X_{t,p}, Y_t) \beta_j(X_{t+1,p}^T, Y_{t+1}^T) \beta_j(X_{t+1}^T, T_{t+1}^T)$,
$\alpha_i(X_{1,p}^{t-1}, Y_1^{t-1})$ are elements of vector $$\alpha(X_1^i, Y_1^i) = \pi \prod_{i=1}^{T} P(X_i, Y_i),$$

$\beta_j(X_{t+1,p}^T, Y_{t+1}^T)$ are elements of vector $$\beta(X_{t+1}^T, Y_{t+1}^T) = \prod_{i=t+1}^{T} P(X_i, Y_i) 1,$$

$\alpha(X_{1,p}^0, Y_1^0) = \pi$,
$\alpha(X_{1,p}^0, Y_i^t) = \alpha(X_{1mpi}^{T-1} Y_1^{t-1}) P(X_{t,p}, Y_t)$ for t=1, 2, . . . , T,
$\beta(X_{T+1,p}^T, Y_t^T) = 1$,
$\beta(X_{t,p}^T, Y_t^T) = P(X_{t,p}, Y_t) \beta(X_{t+1,p}^T, Y_{t+1}^T)$ for t=T−1, T−2, . . . , 1, computing a distance measure $$D(X_{1,p+1}^T, X_{1,p}^T) = \left[\sum_{i=1}^{T} (X_{i,p+1} - X_{i,p}^T)\right]^{\frac{1}{2}}$$

when the distance measure is outside a preselected threshold, incrementing index p and returning to said step of selecting; and when the distance measure is within said preselected threshold, outputting vector $X_p$ for the current value of index p as the best estimate of the transmitted vector X of symbols.

* * * * *